US009341681B2

(12) United States Patent
Kobayakawa et al.

(10) Patent No.: US 9,341,681 B2
(45) Date of Patent: May 17, 2016

(54) ELECTRICAL DEVICE SYSTEM AND BATTERY PACK

(71) Applicant: MAKITA CORPORATION, Anjo-shi, Aichi (JP)

(72) Inventors: Tadahiko Kobayakawa, Anjo (JP); Hitoshi Suzuki, Anjo (JP); Masaaki Fukumoto, Anjo (JP)

(73) Assignee: MAKITA CORPORATION, Anjo-Shi (JP)

(*) Notice: Subject to any disclaimer, the term of this patent is extended or adjusted under 35 U.S.C. 154(b) by 74 days.

(21) Appl. No.: 14/228,850

(22) Filed: Mar. 28, 2014

(65) Prior Publication Data
US 2014/0300366 A1 Oct. 9, 2014

(30) Foreign Application Priority Data

Apr. 5, 2013 (JP) .................. 2013-079559

(51) Int. Cl.
G01R 31/36 (2006.01)
H01M 10/48 (2006.01)
H01M 10/42 (2006.01)
H01M 10/44 (2006.01)
H02J 7/00 (2006.01)
G01R 19/12 (2006.01)

(52) U.S. Cl.
CPC ....... *G01R 31/3624* (2013.01); *H01M 10/4257* (2013.01); *H01M 10/441* (2013.01); *H01M 10/48* (2013.01); *H01M 10/482* (2013.01); *H01M 10/486* (2013.01); *H02J 7/0047* (2013.01); *G01R 19/12* (2013.01); *H01M 2010/4278* (2013.01)

(58) Field of Classification Search
None
See application file for complete search history.

(56) References Cited

U.S. PATENT DOCUMENTS 7,443,139 B2 * 10/2008 Mitsui ................ G01R 31/3624
320/132
7,586,311 B2 * 9/2009 Nozaki .................. B60K 6/485
324/429
7,646,176 B2 * 1/2010 Yamamoto ......... G01R 31/3679
320/134

(Continued)

FOREIGN PATENT DOCUMENTS

EP 2 336 796 A1 6/2011
EP 2 562 895 A1 2/2013
JP A-2012-090368 5/2012

OTHER PUBLICATIONS

Extended Search Report issued in European Patent Application EP 14163454.3 dated on Aug. 13, 2014.

*Primary Examiner* — Jermele M Hollington
*Assistant Examiner* — Suresh K Rajaputra
(74) *Attorney, Agent, or Firm* — Oliff PLC

(57) ABSTRACT

An electrical device system having a battery pack, an electrical device, and a charging device, includes: a current detecting unit that detects a battery current flowing through the battery during a charge to or a discharge from the battery; a battery state detecting unit that detects at least one of a battery voltage and a temperature of a heat generating unit; and a determining unit that estimates an amount of change in at least one of the battery voltage and the temperature of the heat generating unit, based on the battery current, and calculates an amount of actual change in at least one of the battery voltage and the temperature of the heat generating unit, wherein the determining unit determines that the current detecting unit is abnormal, when the difference between the calculated amount of actual change and the estimated amount of change is a default value or more.

5 Claims, 5 Drawing Sheets

(56) References Cited

U.S. PATENT DOCUMENTS

| | | | | |
|---|---|---|---|---|
| 7,665,557 B2 * | 2/2010 | Hughes | B60K 6/48 | 180/53.8 |
| 7,902,829 B2 * | 3/2011 | Tae | B60K 6/48 | 307/10.7 |
| 7,928,736 B2 * | 4/2011 | Yun | B60L 3/0046 | 320/149 |
| 7,956,575 B2 * | 6/2011 | Kawano | H02J 7/0026 | 320/106 |
| 8,120,321 B2 * | 2/2012 | Vezzini | H02J 7/0014 | 307/66 |
| 8,274,291 B2 * | 9/2012 | Tsuchiya | G01R 31/3675 | 320/148 |
| 8,442,718 B2 * | 5/2013 | Ahn | B60L 11/1861 | 701/36 |
| 8,664,960 B2 * | 3/2014 | Tsuchiya | G01R 31/3675 | 320/148 |
| 8,684,596 B2 * | 4/2014 | Nishi | G01K 7/42 | 374/141 |
| 8,823,322 B2 * | 9/2014 | Noda | H01M 10/4257 | 320/116 |
| 8,823,325 B2 * | 9/2014 | Ling | G01R 31/3651 | 320/132 |
| 8,841,880 B2 * | 9/2014 | Aradachi | H02J 7/0031 | 320/106 |
| 8,854,014 B2 * | 10/2014 | Horie | H02J 7/045 | 320/160 |
| 8,885,307 B2 * | 11/2014 | Kobayakawa | H01M 10/44 | 361/87 |
| 9,013,146 B2 * | 4/2015 | Suzuki | H02J 7/0021 | 320/118 |
| 9,063,200 B2 * | 6/2015 | Matsuura | G01R 31/3624 | |
| 9,077,182 B2 * | 7/2015 | Wang | G01R 31/3651 | |
| 2011/0101911 A1 | 5/2011 | Aradachi | | |
| 2011/0133697 A1 | 6/2011 | Matsuura et al. | | |
| 2012/0025770 A1 | 2/2012 | Suzuki et al. | | |
| 2012/0096298 A1 | 4/2012 | Noda et al. | | |
| 2013/0033790 A1 | 2/2013 | Kobayakawa et al. | | |

* cited by examiner

ELECTRICAL DEVICE SYSTEM AND BATTERY PACK

CROSS-REFERENCE TO RELATED APPLICATIONS

This application claims the benefit of Japanese Patent Application No. 2013-079559 filed Apr. 5, 2013 in the Japan Patent Office, the disclosure of which is incorporated herein by reference.

BACKGROUND

The present invention relates to an electrical device system including a battery pack, an electrical device, and a charging device. The present invention also relates to a battery pack.

Conventionally, a battery pack to supply electric power to an electrical device is provided with a current detecting unit that detects a battery current flowing from a battery in the battery pack to the electrical device during a discharge and from a charging device to the battery during a charge.

The current detecting unit is used for monitoring the battery current during the discharge from and the charge to the battery. The current detecting unit includes, for example, a current detecting element (current detection resistor, in general) provided in a conduction path to the battery, and a detection circuit that detects the battery current via the current detecting element.

In the current detecting unit, an abnormal current flowing to the battery and the peripheral circuit cannot be detected if the detection circuit fails. Thus, it is no longer possible to protect the electrical device system from an excess current and the like.

For example, in Japanese Patent Application Publication No. 2012-90368, it has been proposed providing two ICs, that is, a charge and discharge control IC (microcomputer) and a battery voltage monitoring IC, with a function as a detection circuit that detects a battery current via a current detecting element, to determine whether or not the current detecting unit is operating normally, based on a difference in the battery currents acquired from the two ICs.

SUMMARY

According to the technique proposed above, abnormality of the current detecting unit can be determined, and erroneous detection of the battery current, when the current detecting unit is abnormal, can be prevented.

However, the technique proposed above requires two systems of detection circuits for the battery current to determine abnormality of the current detecting unit, for which twice a space may be required. Therefore, there has been a problem that not only a component cost increases but also reduction in size of the battery pack is hindered.

Such problem is not limited to the battery pack, but also occurs in an electrical device and a charging device when a current detecting unit is provided in the electrical device and the charging device.

In the electrical device system including a battery pack, it is desirable that abnormality (failure) of a current detecting unit that detects a battery current can be determined without providing two systems of detection circuits in the current detecting unit.

In one aspect, the present invention relates to an electrical device system provided with a battery pack having a rechargeable battery, an electrical device of which a power source is the battery pack, and a charging device that charges the battery pack.

In the electrical device system, the current detecting unit detects a battery current flowing through the battery during a charge to or a discharge from the battery in the battery pack. A battery state detecting unit detects at least one of a battery voltage, and a temperature of a heat generating unit that generates heat when the battery current flows.

During the charge to or the discharge from the battery, a determining unit estimates an amount of change in at least one of the battery voltage detected by the current detecting unit and the temperature of the heat generating unit, based on the battery current detected by the battery state detecting unit.

Further, the determining unit calculates an actual amount of change in at least one of the battery voltage detected by the battery state detecting unit and the temperature of the heat generating unit, and determines abnormality of the current detecting unit when a difference between the calculated actual amount of change and the estimated amount of change is a default value or more.

That is, during the charge to and the discharge from the battery, the battery voltage and the temperature of the heat generating unit are changed in accordance with the battery current detected by the current detecting unit.

Therefore, in the electrical device system of the present invention in one aspect, the amount of change in the battery voltage or in the temperature of the heat generating unit is estimated based on the battery voltage detected by the current detecting unit, and whether or not the current detecting unit is operating normally is determined by determining whether or not the estimated amount of change matches the actual amount of change.

Therefore, according to the electrical device system of the present invention in one aspect, abnormality (failure) of the current detecting unit can be detected using a battery voltage detection circuit and a temperature detection circuit usually provided in the electrical device system.

Further, according to the electrical device system of the present invention in one aspect, abnormality of the current detecting unit can be detected without providing two systems of detection circuits for battery current detection. Therefore, growing in size of the entire system due to an increase in the number of components for abnormality determination of the current detecting unit may be prevented. In addition, an increase in the cost of the electrical device system can be suppressed.

The determining unit, when determining that the current detecting unit is abnormal, may store the information in a storage unit.

In this case, it is possible to confirm whether or not the information that the current detecting unit is abnormal (failed, in other words) is stored in the storage unit, when the electrical device system is next used. Thereby, operation of the electrical device system in spite of the failure of the current detecting unit can be inhibited.

It is desirable that a non-volatile memory is used as the storage unit.

Use of a non-volatile memory as the storage unit enables to hold the abnormality determination result of the current detecting unit in the storage unit, even if electric power supplied to the storage unit is shut off. Therefore, operation of the electrical device system, in spite of the failure of the current detecting unit, can be inhibited when the electrical device system is next used.

The determining unit may include a counting unit. The counting unit counts a number of times the difference between the actual amount of change and the estimated amount of change is determined to be a default value or more. The determining unit then determines that the current detecting unit is abnormal when the count value by the counting unit reaches a predetermined value.

In this case, the problem can be suppressed due to an instant determination by the determining unit that the current detecting unit is abnormal when the difference between the actual amount of change and the estimated amount of change is a default value or more. Specifically, erroneous detection of abnormality (failure) of the current detecting unit, although the current detecting unit is not actually defective, can be suppressed.

The count value of the counting unit may be updated (incremented or decremented) each time the determining unit determines that the difference between the actual amount of change and the estimated amount of change is the default value or more. Or, when a charge to the battery is completed, the determining unit may set the count value of the counting unit to an initial value.

It is herein contemplated that the current detecting unit is operating normally, if the charge to the battery is completed before the determining unit determines that the current detecting unit is abnormal (failed).

Therefore, initialization of the count value of the counting unit in a case where the charge is completed can suppress erroneous determination by the count operation of the counting unit that the current detecting unit is abnormal (failed).

The current detecting unit subject to abnormal determination may be provided in any one of the battery pack, the electrical device, and the charging device, which constitute the electrical device system.

The battery state detecting unit and the determining unit used to determine abnormality may be provided in the battery pack, the electrical device, or the charging device, which is provided with the current detecting unit, or may be provided at a portion (the battery pack, the electrical device, or the charging device) without the current detecting unit.

In particular, if the present invention is applied to a single body of battery pack provided with the current detecting unit, the battery state detecting unit, and the abnormality determining unit therein, the effect of the present invention can be exerted more significantly.

As compared to the electrical device and the charging device, reduction in size of the battery pack is more strongly demanded. Application of the present invention to the battery pack allows a single body of battery pack to detect abnormality (failure) of the current detecting unit, without increasing the size of the battery pack. The effect of the present invention becomes most noticeable.

BRIEF DESCRIPTION OF THE DRAWINGS

Embodiments of the present invention will now be described below, with reference to the accompanying drawings in which.

DETAILED DESCRIPTION OF THE PREFERRED EMBODIMENTS

Figure 1:
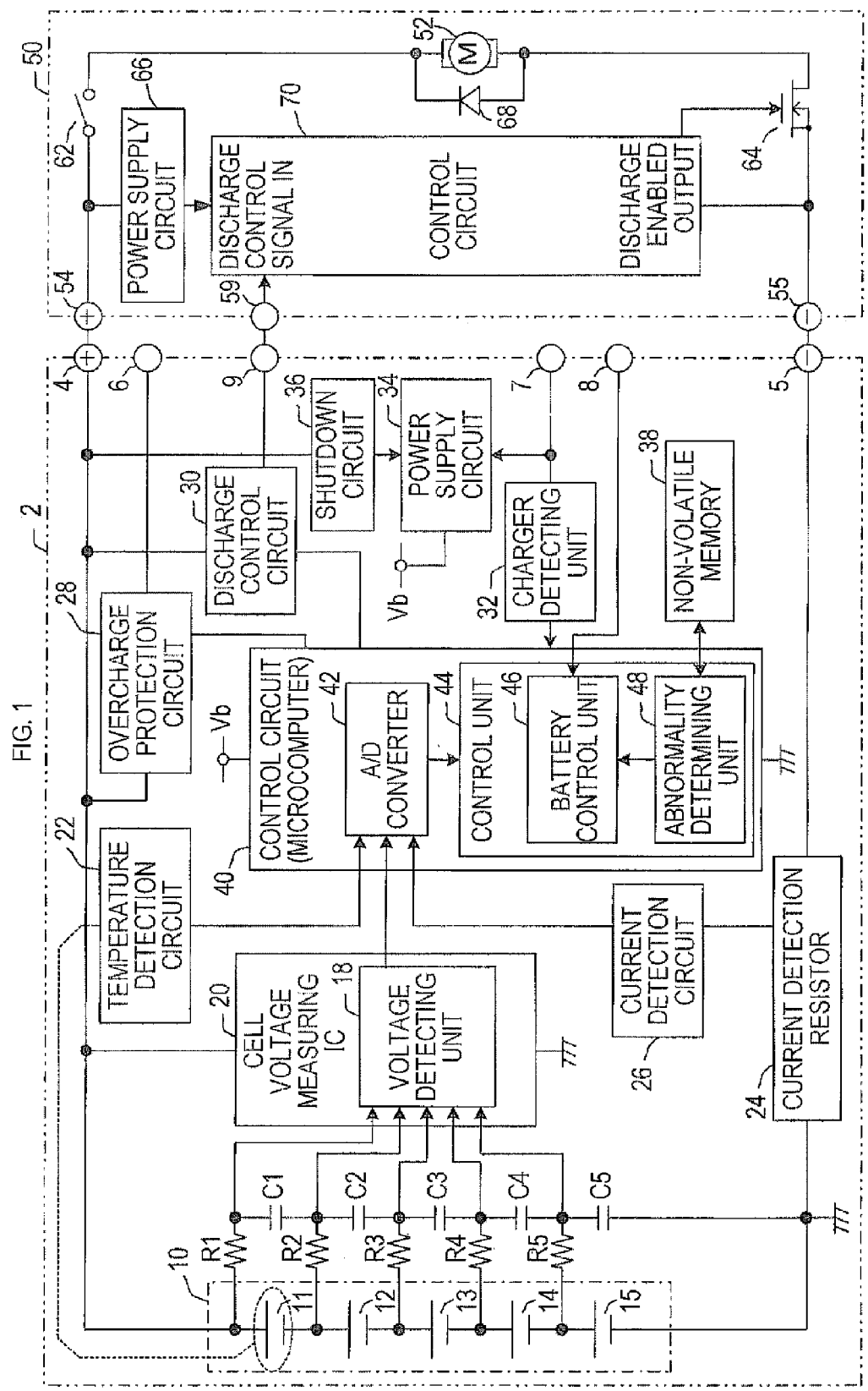
FIG. 1 is a block diagram showing a configuration of a battery pack and an electric power tool according to an embodiment.

As shown in FIG. 1, a battery pack 2 of the present embodiment includes a battery 10 configured by connecting a plurality of chargeable and rechargeable cells 11, 12, 13, 14, and 15 (five in the figure) in series.

Figure 2:
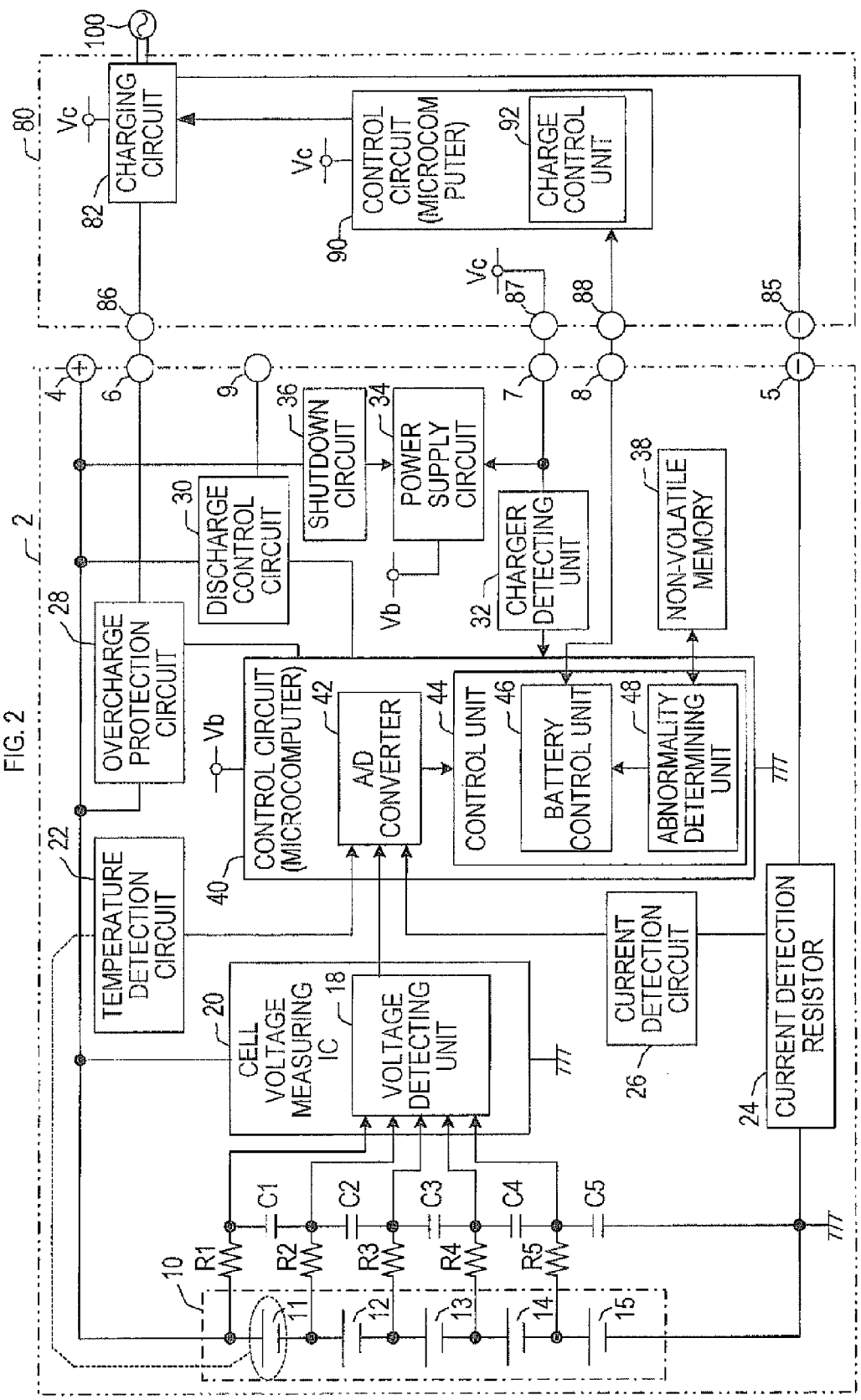
FIG. 2 is a block diagram showing a configuration of the battery pack and a charging device according to the embodiment.

A housing of the battery pack 2 is formed to be selectively attachable to either of an electric power tool 50 and a charging device 80 (see FIG. 2).

A positive electrode side of the battery 10 is connected to a terminal 4, and a negative electrode side thereof is connected to a terminal 5. When the battery pack 2 is attached to the electric power tool 50, the terminal 4 is connected to a terminal 54 on a positive electrode side of the electric power tool 50, and the terminal 5 is connected to a terminal 55 on a negative electrode side thereof.

Therefore, when the battery pack 2 is attached to the electric power tool 50, electric power can be supplied to the electric tool 50 from the battery 10 through the terminals 4, 5 and the terminals 54, 55 on the electric power tool 50 side.

The positive electrode side of the battery 10 is connected to a charging terminal 6 via an overcharge protection circuit 28. In contrast, the charging device 80 is provided with terminals 86, 85 to be connected to the terminals 6, 5 of the battery pack 2 when the battery pack 2 is attached the charging device 80 (see FIG. 2).

Therefore, when the battery pack 2 is attached to the charging device 80, a charge from the charging device 80 to the battery 10 can be performed via the terminals 86, 85, the terminals 6, 5, and the overcharge protection circuit 28.

Therefore, the battery pack 2 of the present embodiment, together with the electric power tool 50 and the charging device 80, constitutes an electrical device system of an embodiment of the present invention.

The overcharge protection circuit 28 cuts off a charging path from the charging device 80 to the battery 10 when an overcharge to the battery 10 is detected by the control circuit 40. The overcharge protection circuit 28 is operated by a control signal from the control circuit 40.

In the battery 10, positive electrode sides of the cells 11 to 15 are connected to a cell voltage measurement IC 20 via resistors R1 to R5, respectively.

The cell voltage measurement IC 20 incorporates a voltage detecting unit 18 that individually detects a voltage between both ends of each of the cells 11 to 15 (cell voltage).

A detection signal corresponding to the cell voltage of each of the cells 11 to 15 detected by the voltage detecting unit 18 is input to the control circuit 40.

In an input path of the cell voltage to the cell voltage measurement IC 20, capacitors C1 to C5 are provided, which are respectively connected in parallel to the cells 11 to 15 via the resistors R1 to R5.

The capacitors C1 to C5 inhibit the cell voltage to be input to the cell voltage measurement IC 20 from being fluctuated by noise, etc.

A current detection resistor 24 is connected to a connection path on the negative electrode side that connects the negative electrode side of the battery 10 to the terminal 5. The current detection resistor 24 detects a discharge current from the battery 10 to the electric power tool 50, and a charge current from the charging device 80 to the battery 10.

A current detection circuit 26 is connected to the current detection resistor 24. The current detection circuit 26 detects a battery current (a discharge current and a charge current, in more detail) from a voltage between both ends of the current detection resistor 24, and inputs a detection signal corresponding to the battery current to the control circuit 40.

The battery 10 is provided with a temperature detection circuit 22 that detects a temperature of the cell. A detection signal from the temperature detection circuit 22 is also input to the control circuit 40.

The control circuit 40 is configured as a one-chip microcomputer essentially including a CPU, a ROM, a RAM and the like, and further includes an A/D converter 42 and a control unit 44, which is realized by the CPU executing a control program stored in the ROM.

The control unit 44 is a functional block of the control circuit 40, and functions as a battery control unit 46 and/or an abnormality determining unit 48. The control unit 44 (the battery control unit 46 and/or the abnormality determining unit 48) functions to monitor the charge and discharge currents and the battery voltage during a charge to and a discharge from the battery 10, so as to stop the charge and the discharge in the case of abnormality.

The abnormality determining unit 48 determines the abnormality (failure, in other words) of the current detecting unit, which is provided with the current detection resistor 24 and the current detection circuit 26. A nonvolatile memory 38 for storing the abnormality detection result by the abnormality determining unit 48 is connected to the control circuit 40.

The A/D converter 42 converts to digital data and takes in detection signals from the cell voltage measurement IC 20, the current detection circuit 26, and the temperature detection circuit 22, in accordance with a command from the control unit 44.

The battery pack 2 is provided with a terminal 7 for taking in a power supply voltage Vc from the charging device 80, a terminal 8 for communication with the charging device 80, and a terminal 9 for outputting a discharge control signal to the electric power tool 50.

A charger detecting unit 32 is connected to the terminal 7. The charger detecting unit 32 detects that the battery pack 2 is attached to the charging device 80, when a potential of terminal 7 becomes a higher level than an input voltage from the charging device 80 (power supply voltage Vc). A detection signal from the charger detecting unit 32 is input to the control circuit 40.

Therefore, the control circuit 40 can detect that the battery pack 2 is attached to the charging device 80, and an operation mode of the battery pack 2 is turned into a charge mode for charging the battery 10 from the charging device 80, by the detection signal input from the charger detecting unit 32.

A discharge control circuit 30, which receives electric power supplied from the battery 10 to generate a discharge control signal, is provided in the terminal 9. When a terminal 59 of the electric power tool 50 is connected to the terminal 9, the discharge control circuit 30 outputs a discharge control signal to the electric power tool 50 via the terminals 9, 59.

The discharge control circuit 30 is connected to the control circuit 40. The control circuit 40 can detect that the battery pack 2 is attached to the electric power tool 50 and the operation mode of the battery pack 2 is turned into a discharge mode for supplying electric power to the electric power tool 50, based on an output state of the discharge control signal from the discharge control circuit 30.

The battery pack 2 is provided with a power supply circuit 34 that supplies a power supply voltage (direct current constant voltage) Vb to the control circuit 40 and the peripheral circuits.

The power supply circuit 34 receives power supply from the battery 10 or the charging device 80 connected via the terminal 7, and generates the power supply voltage Vb.

In a power supply path from the battery 10 to the power supply circuit 34, a shutdown circuit 36 is provided that cuts off the power supply path when the battery voltage drops.

Each of the electric power tool 50 and the charging device 80, which constitute the electrical device system together with the battery pack 2, is configured as shown in FIGS. 1 and 2.

As shown in FIG. 1, the electric power tool 50 includes a DC motor (hereinafter, simply called a motor) 52 as a power source. The motor 52 is provided on a conduction path for receiving power supply from the battery 10 in the battery pack 2 via the terminals 54, 55 and the terminals 4, 5.

A main switch 62, which is turned on and off by a user of the electric power tool 50, and a switching element (FET in the FIG. 64 for conduction control to be turned on and off by the control circuit 70, are provided on the conduction path of the motor 52.

A diode 68 is connected in parallel to the motor 52. The diode 68 returns, to a positive electrode side of the motor 52, a high voltage generated on a negative electrode side of the motor 52 by the energy stored in the windings of the motor 52, when current is applied to the motor 52 and the main switch 62 or the switching element 64 is turned off (in other words, the conduction path is cut off).

The control circuit 70 receives a discharge control signal input from the battery pack 2 via the terminals 9, 59 and turns on the switching element 64, thereby forming a conduction path to the motor 52, and permits a discharge from the battery 10.

The electric power tool 50 is provided with a power supply circuit 66 that receives power supply from the battery 10 and generates a power supply voltage. The control circuit 70 receives electric power from the power supply circuit 66 to operate.

Accordingly, in the electric power tool 50, as a result that the battery pack 2 is attached and electric power is supplied from the battery 10 to the power supply circuit 66, the power supply circuit 66 and the control circuit 70 sequentially start to operate.

Then, the switching element 64 is turned on by the operation of the control circuit 70. Thereafter, as the user manipulates the main switch 62, it is possible to switch driving/stopping of the motor 52 (and thus the electric power tool 50).

The charging device 80, as shown in FIG. 2, is provided with a charging circuit 82. The charging circuit 82 receives power supply from a commercial power supply 100 to charge the battery 10 in the battery pack 2.

Specifically, the charging circuit 82 converts a DC voltage supplied from the commercial power supply 100 to an AC voltage to charge the battery 10. A charge to the battery 10 is controlled by the control circuit 90.

The charging circuit 82 generates the power supply voltage Vc for driving the control circuit 90. The generated power supply voltage Vc is output to the battery pack 2 via the terminal 87 and the terminal 7 on the battery pack 2 side.

The supply voltage Vc is generated whenever the charging circuit 82 is supplied with electric power from the commercial power source 100. Therefore, even if the power supply from the battery 10 to the power supply circuit 34 is disconnected in the battery pack 2, the power supply voltage Vc is supplied to the power supply circuit 34 in the battery pack 2 from the terminal 87 via the terminal 7 if the charging circuit 82 is connected to the commercial power source 100.

Accordingly, even if the battery voltage drops and the operation of the control circuit 40 is stopped, the battery 10 can be charged by attaching the battery pack 2 to the charging device 80 so as to operate the control circuit 40.

A control circuit 90 is configured as a microcomputer, which essentially includes a CPU, a ROM, a RAM, and so on. The control circuit 90 functions as a charge control unit 92 when the CPU executes a control program stored in the ROM.

The charging device 80 is provided with a terminal 88. When the battery pack 2 is attached to the charging device 80, the terminal 88 is connected to the terminal 8 on the battery pack 2 side.

The control circuit 90 communicates with the control circuit 40 on the battery pack 2 side via the terminals 88, 8 to acquire a battery voltage and a charge current to the battery 10, and controls the charging circuit 82.

Thus, in the present embodiment, the electrical device system as one example of the present invention is configured by the battery pack 2, the electric power tool 50, and the charging device 80. The battery pack 2 is provided with the current detection resistor 24 and the current detection circuit 26 as an example of the current detecting unit.

The control circuit 40 monitors a battery current (specifically, a discharge current and a charge current) based on a detection signal from the current detection circuit 26 by the operation of the battery control unit 46, during a discharge from the battery 10 to the electric power tool 50 and a charge to the battery 10 from the charging device 80.

The control circuit 40, when detecting abnormality of the battery current, stops output of a discharge control signal from the discharge control circuit 30 to stop driving of the motor 52 on the electric power tool 50 side, or shuts off a charge path by the overcharge protection circuit 28, to stop charging to the battery 10 by the charging device 80.

Thus, when a failure occurs in the current detecting resistor 24 and the current detection circuit 26 as the current detecting unit, and the battery current can be no longer detected correctly, it is no longer possible to stop driving of the motor 52 on the electric power tool 50 side, or to stop charging the battery 10 by the charging device 80, during abnormality of the battery current.

Therefore, in the present embodiment, the control circuit 40 is provided with a function as the abnormality determining unit 48 that determines abnormality of the current detecting unit which includes the current detection resistor 24 and the current detection circuit 26. When it is determined that the current detecting unit is abnormal, the non-volatile memory 38 stores the information. Thereby, until the current detecting unit is repaired, a charge to and a discharge from the battery 10 is prohibited.

Hereinafter, an abnormality determination process to be performed in the control circuit 40 to achieve the function as the abnormality determining unit 48 will be described with reference to the flowcharts of FIGS. 3 and 4.

Figure 3:
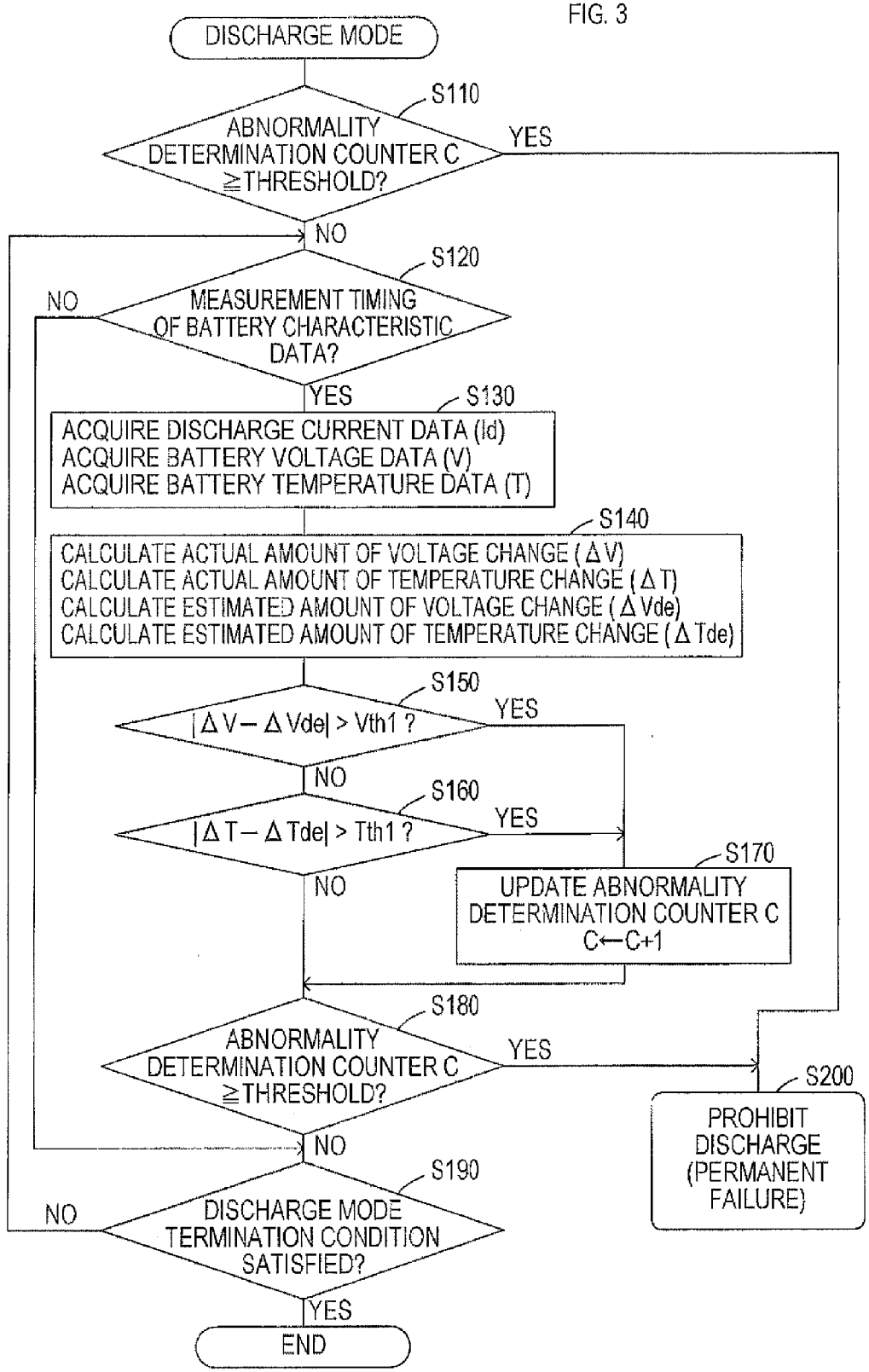
FIG. 3 is a flowchart showing an abnormality determination process executed by a control circuit when the battery pack is in a discharge mode.

As shown in FIG. 3, in the abnormality determination process in a discharge mode, it is firstly determined in S110 (S denotes a step) whether a count value of an abnormality determination counter C for counting a number of times it is determined that the current detecting unit is abnormal is equal to or greater than a preset threshold.

Then, in S110, when it is determined that the value of the abnormality determination counter C is not equal to or greater than the threshold, the process proceeds to S120. In S120, it is determined whether measurement timing for battery characteristic data has come.

The battery characteristic data, in one example, is at least one of the following:
discharge current data (Id) acquired from a detection signal from the current detection circuit 26;
battery voltage data (V) acquired from a detection signal from the cell voltage measurement IC 20; and
battery temperature data (T) acquired from a detection signal from the temperature detection circuit 22.

The control circuit 40 is configured such that the measurement timing for the battery characteristic data is generated at predetermined time intervals. In S120, it is determined whether the measurement timing for the battery characteristic data has come based on an elapsed time from the previous measurement timing.

In S120, when it is determined that the measurement timing for the battery characteristic data has come, the process proceeds to S130. In S130, the detection signals from the current detection circuit 26, the cell voltage measurement IC 20, and the temperature detection circuit 22 are taken in via the A/D converter 42, to acquire the discharge current data (Id), the battery voltage data (V), and the battery temperature data (T).

In S140, amounts of change in the battery voltage and the battery temperature (an estimated amount of voltage change $\Delta Vde$, and an estimated amount of temperature change $\Delta Tde$) caused by the discharge current flowing from the battery 10 are calculated based on the discharge current data (Id) acquired in S130 and a calculation formula (or map) preset for the estimation of an amount of change.

Further, in S140, amounts of change (an actual amount of voltage change $\Delta V$ and an actual amount of temperature change $\Delta T$) are calculated from the previous values of the battery voltage data (V) and the battery temperature data (T) acquired this time in S130.

Next, in S150, it is determined whether an absolute value of the difference $|\Delta V - \Delta Vde|$ between the actual amount of voltage change $\Delta V$ and the estimated amount of voltage change $\Delta Vde$ calculated in S140 exceeds a default value Vth1 preset for abnormality determination.

In addition, in S150, if it is determined that $|\Delta V - \Delta Vde|$ is equal to or smaller than the default value Vth1, the process proceeds to S160. In S160, it is determined whether an absolute value of the difference $|\Delta T - \Delta Tde|$ between the actual amount of temperature change $\Delta T$ and the estimated amount of temperature change $\Delta Tde$ calculated in S140 exceeds a default value Tth1 preset for abnormality determination.

If it is determined that $|\Delta V - \Delta Vde|$ exceeds the default value Vth1 in S150 or it is determined $|\Delta T - \Delta Tde|$ exceeds the default value Tth1 in S160, it is determined that the detection result of the discharge current by the current detection circuit 26 is abnormal (in other words, it is determined that the current detecting unit, which includes the current detection resistor 24 and the current detection circuit 26, is abnormal). The process proceeds to S170.

In S170, the abnormality determination counter C is incremented (increased by 1). The process moves to S180. In addition, in S160, even if it is determined that $|\Delta T - \Delta Tde|$ does not exceed the default value Tth1, the process moves to S180.

In S180, it is determined whether the count value of the abnormality determination counter C is equal to or greater than the preset threshold.

If it is determined the value of the abnormality determination counter C is equal to or greater than the threshold, the process proceeds to S200. It is determined that the current detecting unit has failed. Discharge from the battery 10 is prohibited, and the information (permanent failure of the current detecting unit) is stored in the nonvolatile memory 38.

The process in S200 is performed in a similar manner even when the value of the abnormality determination counter C is determined to be equal to or greater than the threshold in S110.

On the other hand, if it is determined in S180 that the value of the abnormality determination counter C is not equal to or greater than the threshold, or if it is determined in S120 that the measurement timing for the battery characteristic data has not yet come, the process proceeds to S190.

In S190, it is determined whether the battery pack 2 is detached from the electric power tool 50, and a discharge mode termination condition is satisfied. If the discharge mode termination condition is satisfied, the abnormality determination process ends. If the discharge mode termination condition is not satisfied, the process again proceeds to S120, so that the above-described series of processes are executed.

Figure 4:
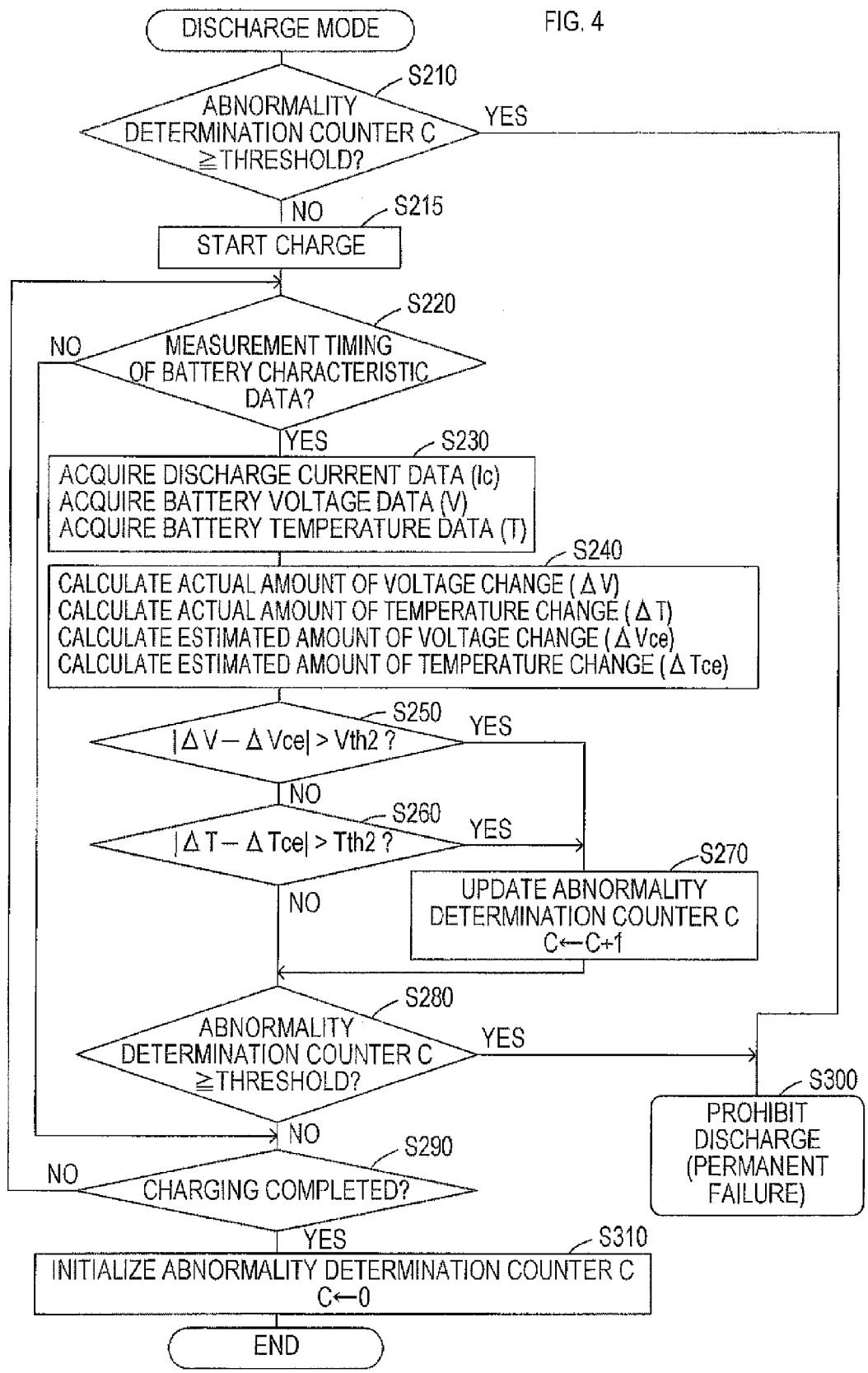
FIG. 4 is a flowchart showing the abnormality determination process executed by the control circuit when the battery pack is in a charge mode.

Next, as shown in FIG. 4, in the abnormality determination process in a charge mode, it is first determined in S210 whether the count value of the abnormality determination counter C is equal to or greater than the threshold. If the count value of the abnormality determination counter C is not equal to or greater than the threshold, the process proceeds to S215, so that the charging device 80 initiates a charge to the battery 10. Then, the process proceeds to S220.

In S220, it is determined whether the measurement timing for the battery characteristic data has come.

In S220, if it is determined that the measurement timing for the battery characteristic data has come, the process proceeds to S230. In S230, detection signals from the current detection circuit 26, the cell voltage measurement IC 20, and the temperature detection circuit 22 are taken in via the A/D converter 42. Thereby, the charging current data (Ic), the battery voltage data (V), and the battery temperature data (T) are acquired.

In S240, amounts of change in the battery voltage and the battery temperature (an estimated amount of voltage change $\Delta Vce$ and an estimated amount of temperature change $\Delta Tce$) caused by the supply of the charging current from the charging device 80 to the battery 10 are calculated based on the charge current data (Id) acquired in S230 and a calculation formula (or map) preset for estimation of amount of change.

Further, in S240, the amounts of change (an actual amount of voltage change $\Delta V$ and an actual amount of temperature change $\Delta T$) from the previous values of the battery voltage data (V) and the battery temperature data (T) acquired this time in S230 are calculated.

Next, in S250, it is determined whether the absolute value of the difference $|\Delta V - \Delta Vce|$ between the actual amount of voltage change $\Delta V$ calculated in S240 and the estimated amount of voltage change $\Delta Vce$ exceeds a default value Vth2 preset for abnormality determination.

In addition, in S250, if it is determined that $|\Delta V - \Delta Vce|$ does not exceed the default value Vth2, the process proceeds to S260. In S260, it is determined whether the absolute value of the difference $|\Delta T - \Delta Tce|$ between the actual amount of temperature change $\Delta T$ calculated in S140 and the estimated amount of temperature change $\Delta Tce$ exceeds the default value Tth2 preset for abnormality determination.

If it is determined in S250 that $|\Delta V - \Delta Vce|$ exceeds the default value Vth2 or it is determined in S260 that $|\Delta T - \Delta Tce|$ exceeds the default value Tth2, it is determined that the detection result of the charge current by the current detection circuit 26 (in other words, the current detecting unit) is abnormal. The process proceeds to S270.

In S270, the abnormality determination counter C is incremented (increased by 1). The process moves to S280. In addition, in S260, even if it is determined that $|\Delta T - \Delta Tce|$ does not exceed the default value Tth2, the process moves to S280.

In S280, it is determined whether the count value of the abnormality determination counter C is equal to or greater than the preset threshold.

If the value of the abnormality determination counter C is equal to or greater than the threshold, the process proceeds to S300. It is determined that the current detecting unit has failed, and a charge to the battery 10 from the charging device 80 is prohibited. The information (permanent failure of the current detecting unit) is stored in the nonvolatile memory 38.

If it is determined in S210 that the value of the abnormality determination counter C is equal to or greater than the threshold, the process in S300 is performed in a similar manner.

On the other hand, if it is determined in S280 that the value of the abnormality determination counter C is not equal to or greater than the threshold, or, if it is determined in S220 that the measurement timing for the battery characteristic data has not yet come, the process proceeds to S290.

In S290, it is determined whether the charge to the battery 10 from the charging device 80 has been completed. If the charge has been completed, the abnormality determination counter C is initialized to 0 in S310. Thereafter, the abnormality determination process ends.

If the charge is not completed, the process proceeds again to S220, so that the above-described series of processes are executed.

As described above, in the battery pack 2 of the present embodiment, when the operation mode is the discharge mode and the charge mode, the control circuit 40 estimates the amounts of change in the battery voltage and the battery temperature from the battery current (the discharge current or the charge current) acquired by the detection signal from the current detection circuit 26.

Then, the control circuit 40 determines that an abnormality has occurred in the current detecting unit, which includes the current detection resistor 24 and the current detection circuit 26, when the difference between the estimation result (the estimated amount of voltage change and the estimated amount of temperature change) and the actual amounts of change in the battery voltage and the battery temperature exceeds the default value for abnormality determination.

Further, the control circuit 40 when determining that the current detecting unit is abnormal, counts the number of the determination. When the count value reaches a predetermined threshold, the control circuit 40 determines that the current detecting unit is failed, prohibits a charge to and a discharge from the battery 10, and stores the information on permanent failure of the current detecting unit in the nonvolatile memory 38.

Accordingly, in the battery pack 2 of the present embodiment, abnormality (failure) of the current detecting unit can be detected, using the battery voltage detection circuit usually provided in the battery pack 2 (the cell voltage measurement IC 20 in the present embodiment), and the temperature detection circuit 22 for battery temperature detection.

Therefore, according to the battery pack 2 of the present embodiment, it is possible to determine whether the detected battery current is normal, in other words, whether the current detecting unit is abnormal, without providing two systems of detection circuits for battery current detection, as in the prior art, and to simplify the configuration for abnormality determination.

Therefore, according to the present embodiment, the problem can be solved in which the number of components increases in order to determine whether the current detecting unit is abnormal and thus reduction in size of the battery pack 2 cannot be achieved. Or, the problem can be solved in which an increase in the cost of the battery pack 2 occurs.

Further, in the present embodiment, when the number of the abnormality determination of the current detecting unit has reached a predetermined threshold, it is determined that the current detecting unit has failed, and a charge to and a discharge from the battery 10 are prohibited. Therefore, even if it is erroneously determined the current detecting unit is abnormal due to a disturbance such as noise, a charge and a discharge are never prohibited, and noise resistance can be improved.

Further, the abnormality determination counter C for counting the number of the abnormality determination of the current detecting unit is initialized to 0 when the charge from the charging device 80 to the battery 10 is completed in the charge mode. Thus, it is possible to inhibit the current detecting unit from being determined failed due to increase in the number of false determinations.

Further, in the present embodiment, when the value of the abnormality determination counter C reaches the threshold and it is determined that the current detecting unit has been failed (permanently failed), the information is written to the nonvolatile memory 38.

Therefore, according to the present embodiment, the detection result on the permanent failure of the current detecting unit is not erased by a discharge from the battery 10. Until the current detecting unit is repaired and the non-volatile memory 38 is initialized, a charge to and a discharge from the battery 10 can be prohibited.

In the present embodiment, the cell voltage measurement IC 20 and the temperature detection circuit correspond to an example of the battery state detecting unit of the present invention. The control circuit 40 (abnormality determining unit 48, in detail) corresponds to an example of the determining unit of the present invention. The abnormality determination counter C used to count the number of the abnormality determination corresponds to an example of the counting unit of the present invention.

An embodiment of the present invention has been described in the foregoing, but the present invention is not limited to the above embodiment, and can take various modes within the scope of the gist of the present invention.

For example, in the above embodiment, it is described that the current detecting unit is provided in the battery pack 2, which constitutes an electrical device system, and the abnormality determination is carried out in the battery pack 2. However, if the current detecting unit is provided in the electric power tool 50, which is the electrical device, or in the charging device 80, it is preferable that abnormality is determined in these units.

Figure 5B:
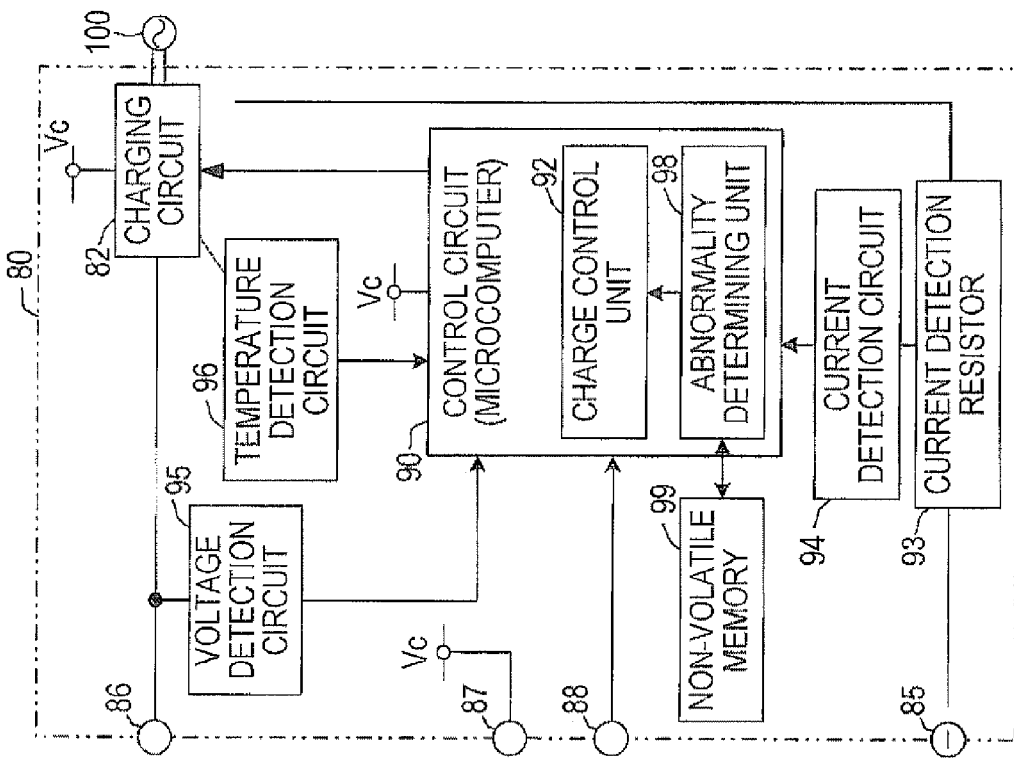
FIGS. 5A and 5B are block diagrams showing variations of the electric power tool and the charging device.
Figure 5A:
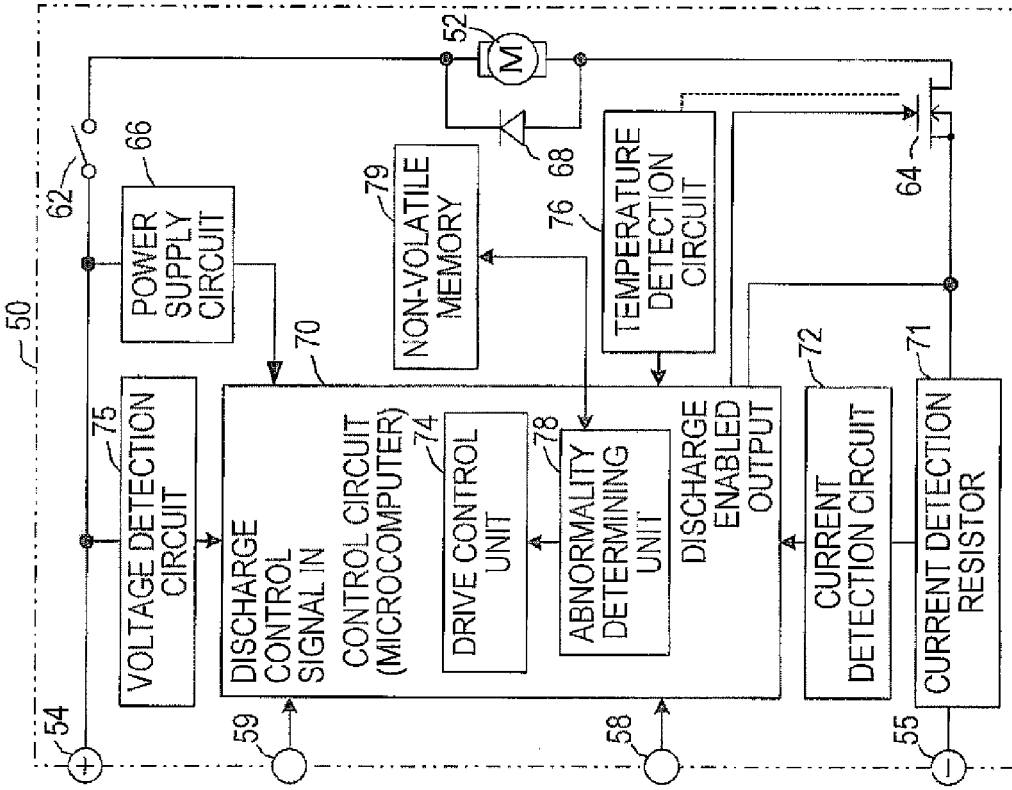

For this purpose, the electric power tool 50 and the charging device 80 may be respectively constituted as shown FIGS. 5A and 5B.

Hereinafter, these configurations will be described as modifications 1 and 2 of the above embodiment.

Modification 1

The electric power tool 50 shown in FIG. 5A is provided with a current detecting resistor 71 on a conduction path leading from the switching element 64 to the terminal 55. The electric power tool 50 is configured such that a current detection circuit 72 detects a motor current from a voltage between both ends of the current detection resistor 71 (in this case, a discharge current from the battery 10). The detection signal from the current detection circuit 72 is input to the control circuit 70.

The control circuit 70 is configured as a microcomputer which essentially includes a CPU, a ROM, a RAM and the like. The control circuit 70 functions as a drive control unit 74 and an abnormality determining unit 78 as the CPU executes a control program stored in the ROM.

The drive control unit 74 outputs a discharge enable signal to turn on the switching element 64 based on a discharge control signal from the battery pack 2, and forms a conduction path to the motor 52.

Further, the electric power tool 50 shown in FIG. 5A is provided with a voltage detection circuit 75, a temperature detection circuit 76, and a non-volatile memory 79. The voltage detection circuit 75 detects a battery voltage. The temperature detection circuit 76 detects a temperature of the switching element 64 which generates heat as the motor current flows. The non-volatile memory 79 stores information that the current detecting unit is abnormal (permanently failed).

Then, the abnormality determining unit 78 determines abnormality of the current detecting unit, which includes the current detection resistor 71 and the current detection circuit 72, based on the detection signals from the current detection circuit 72, the voltage detection circuit 75, and the temperature detection circuit 76, in the same procedure as in the abnormality determination process in the discharge mode shown in FIG. 3.

Therefore, according to the electric power tool 50 shown in FIG. 5A, it is possible to determine abnormality of the current detecting unit provided in the electric power tool 50. The same effect as in the battery pack 2 of the above embodiment can be achieved.

Modification 2

Here, the charging device 80 shown in FIG. 5B is provided with a current detection resistor 93 on a path of a charge current from the charging circuit 82 to the terminal 85. The charging device 80 is configured such that a current detection circuit 94 detects a motor current (a charge current, in this case) from a voltage between both ends of the current detection resistor 93. A detection signal from the current detection circuit 94 is input to the control circuit 90.

The control circuit 70 functions as a charge control unit 92 and an abnormality determining unit 98 as the CPU executes the control program stored in the ROM.

Further, the charging device 80 shown in FIG. 5B is provided with a voltage detection circuit 95, a temperature detection circuit 96, and a non-volatile memory 99. The voltage detection circuit 95 detects a battery voltage. The temperature detection circuit 96 detects a temperature of the charging circuit 82, which generates heat as the charge current flows. The non-volatile memory 99 stores information that the current detecting unit is abnormal (permanently failed).

The abnormality determining unit 98 determines abnormality of the current detecting unit which includes the current detection resistor 93 and the current detection circuit 94, based on detection signals from the current detection circuit 94, the voltage detection circuit 95, and the temperature detection circuit 96, in the same procedure as in the abnormality determination process in the charge mode shown in FIG. 4.

Therefore, according to the charging device 80 shown in FIG. 5B, it is possible to determine abnormality of the current detecting unit provided in the charging device 80. The same effect as in the battery pack 2 of the above embodiment can be achieved.

In the above embodiment and the modifications 1 and 2, an amount of voltage change in the battery voltage, and an amount of temperature change in the heat generating unit (specifically, the cell of the battery 10, the switching element 64, and the charging circuit 82) of which temperature changes as the battery current flows, are estimated based on the battery current detected by the current detecting unit.

If either of the differences (absolute values) between the estimated amounts of change in the battery voltage and the temperature and the actual amounts of change in the battery voltage and the temperature, exceeds a predetermined value, it is determined that the current detecting unit is abnormal.

However, parameters used for the abnormality determination may be only the amount of change in the battery voltage or only the amount of change in the temperature of the heat generating unit.

Further, in the above embodiment and the modifications 1 and 2, it is described such that abnormality of the current detecting unit is determined in the device provided with the current detecting unit (that is, in the battery pack 2, in the electric power tool 50, or in the charging device 80).

However, for example, abnormality of the current detecting unit provided in the electric power tool 50 or the charging device 80 may be determined in the battery pack 2. That is, among the battery pack, the electrical device, and the charging device, which constitute the electrical device system, a device provided with the current detecting unit and a device that determines abnormality of the current detecting unit may differ.

However, in this case, it is necessary to configure the electrical device system such that the battery current detected by the current detecting unit, the battery voltage required for abnormality determination, the temperature and the like are transmitted and received between the devices so that the device that determines abnormality can receive such data.

Further, in the above embodiment and the modifications 1 and 2, the electrical device, which constitutes the electrical device system, is described as the electric power tool 50. However, the present invention can be applied to a system having an electrical device which can become available with a rechargeable battery pack attached thereto, in the same manner as in the above embodiment.

In particular, in a system including an electric power tool or a gardening tool having a large charge current or discharge current, since changes in temperature and in voltage appear significantly in response to current change, the present invention, if applied to this type of system, enables determination of abnormality of the current detecting unit more efficiently.

DESCRIPTION OF REFERENCE NUMERALS

2 . . . battery pack, 10 . . . battery, 20 . . . cell voltage measurement IC, 22, 76, 96 . . . temperature detection circuit, 24, 71, 93 . . . current detection resistor, 26, 72, 94 . . . current detection circuit, 28 . . . overcharge protection circuit, 30 . . . discharge control circuit, 32 . . . charger detecting unit, 34, 66 . . . power supply circuit, 36 . . . shutdown circuit, 38, 79, 99 . . . non-volatile memory, 40, 70, 90 . . . control circuit, 42 . . . A/D converter, 44 . . . control unit, 46 . . . battery control unit, 48, 78, 98 . . . abnormality determining unit, 50 . . . electric power tool, 52 . . . motor, 62 . . . main switch, 64 . . . switching element, 68 diode, 74 . . . drive control unit, 75, 95 . . . voltage detection circuit, 80 . . . charging device, 82 . . . charging circuit, 92 . . . charge control unit.

What is claimed is:

1. An electrical device system provided with a battery pack having a rechargeable battery, an electrical device of which a power source is the battery pack, and a charging device that charges the battery pack, the system comprising:
   a current detecting unit that detects a battery current flowing through the battery during a charge to or a discharge from the battery;
   a battery state detecting unit that detects at least one of a battery voltage and a temperature of a heat generating unit that generates heat when the battery current flows; and
   a determining unit that estimates an amount of change in at least one of the battery voltage detected by the battery state detecting unit and the temperature of the heat generating unit based on the battery current detected by the current detecting unit during a charge to or a discharge from the battery, and calculates an actual amount of change in at least one of the battery voltage detected by the battery state detecting unit and the temperature of the heat generating unit, wherein the determining unit determines that the current detecting unit is abnormal when a difference between the calculated actual amount of change and the estimated amount of change is a default value or more, wherein the determining unit includes a counting unit that counts a number of times the difference between the actual amount of change and the estimated amount of change is determined to be the default value or more, and, when a count value by the counting unit reaches a predetermined value, determines that the current detecting unit is abnormal.

2. The electrical device system according to claim 1, wherein the determining unit, when determining that the current detecting unit is abnormal, stores the information in a storage unit.

3. The electrical device system according to claim 2, wherein the storage unit is a non-volatile memory.

4. The electrical device system according to claim wherein the determining unit, when a charge to the battery is completed, sets the count value of the counting unit to an initial value.

5. A battery pack having a rechargeable battery, the battery pack comprising:
   a current detecting unit that detects a battery current flowing through the battery;
   a battery state detecting unit that detects at least one of a battery voltage and a temperature of the battery; and
   a determining unit that estimates an amount of change in at least one of the battery voltage and the temperature detected by the battery state detecting unit, based on the battery current detected by the current detecting unit, and calculates an actual amount of change in at least one of the battery voltage and the temperature detected by the battery state detecting unit, wherein the determining unit determines that the current detecting unit is abnormal when a difference between the calculated actual amount of change and the estimated amount of change is a default value or more, wherein the determining unit includes a counting unit that counts a number of times the difference between the actual amount of change and the estimated amount of change is determined to be the default value or more, and, when a count value by the counting unit reaches a predetermined value, determines that the current detecting unit is abnormal.

* * * * *